(12) United States Patent
Kitayama et al.

(10) Patent No.: US 9,067,733 B2
(45) Date of Patent: Jun. 30, 2015

(54) PITCH CHANGE DEVICE AND PITCH CHANGE METHOD

(75) Inventors: Tomohiro Kitayama, Chiba (JP); Takeshi Yasooka, Yamato (JP)

(73) Assignee: NISSAN MOTOR CO., LTD., Yokohama-shi, Kanagawa (JP)

( * ) Notice: Subject to any disclaimer, the term of this patent is extended or adjusted under 35 U.S.C. 154(b) by 231 days.

(21) Appl. No.: 13/704,275

(22) PCT Filed: Jun. 15, 2011

(86) PCT No.: PCT/JP2011/063705
§ 371 (c)(1),
(2), (4) Date: Jan. 30, 2013

(87) PCT Pub. No.: WO2011/158865
PCT Pub. Date: Dec. 22, 2011

(65) Prior Publication Data
US 2013/0129463 A1    May 23, 2013

(30) Foreign Application Priority Data

Jun. 17, 2010   (JP) ................................. 2010-138339

(51) Int. Cl.
*B21B 39/22*    (2006.01)
*B65G 1/02*    (2006.01)
*H01L 21/677*    (2006.01)

(52) U.S. Cl.
CPC .......... *B65G 1/026* (2013.01); *H01L 21/67781* (2013.01); *H01L 21/677* (2013.01)

(58) Field of Classification Search
CPC ...... B65G 1/026; B65G 49/07; H01L 21/677; H01L 21/67781; H01L 21/22; H01L 21/31; B21B 39/22
USPC .......... 414/754, 816, 331.01, 331.03, 331.04, 414/331.08, 936, 938, 774; 211/175, 207, 211/208
See application file for complete search history.

(56) References Cited

U.S. PATENT DOCUMENTS

| | | | | |
|---|---|---|---|---|
| 3,669,273 A | * | 6/1972 | Kurita | .......................... 210/225 |
| 4,957,406 A | * | 9/1990 | Akagawa | ................. 414/416.02 |
| 4,958,982 A | * | 9/1990 | Champet et al. | ........... 414/751.1 |
| 5,273,244 A | * | 12/1993 | Ono | .......................... 248/176.3 |
| 5,423,503 A | * | 6/1995 | Tanaka et al. | ............... 248/277.1 |

(Continued)

FOREIGN PATENT DOCUMENTS

| | | |
|---|---|---|
| JP | 7-183357 A | 7/1995 |
| JP | H09260463 A | 10/1997 |

(Continued)

*Primary Examiner* — Saul Rodriguez
*Assistant Examiner* — Lynn Schwenning
(74) *Attorney, Agent, or Firm* — Young Basile

(57) ABSTRACT

A pitch conversion device and pitch conversion method is directed to convert the pitch of a plurality of partition members arranged parallel to each other along an X-direction and include a plurality of entry members arranged parallel to each other in the X-direction and configured to enter between neighboring partition members, and a pushing member to push the plurality of entry members in turn and allow them to enter neighboring partition members while moving in the X direction. The entry members are biased in an exiting direction from between the neighboring partition members.

15 Claims, 7 Drawing Sheets

(56) References Cited

U.S. PATENT DOCUMENTS

| | | | |
|---|---|---|---|
| 5,635,061 A * | 6/1997 | Gelfand et al. | 210/225 |
| 5,674,384 A * | 10/1997 | Higgins | 210/106 |
| 7,260,448 B2 * | 8/2007 | Goto et al. | 700/218 |
| 2001/0009641 A1 * | 7/2001 | Haraguchi et al. | 414/416.03 |
| 2003/0111494 A1 * | 6/2003 | Lin et al. | 222/505 |
| 2006/0193939 A1 * | 8/2006 | Ohtsuka et al. | 425/406 |
| 2008/0216880 A1 * | 9/2008 | Shiomi et al. | 134/56 R |
| 2009/0236005 A1 * | 9/2009 | Bowman et al. | 140/92.2 |

FOREIGN PATENT DOCUMENTS

| | | |
|---|---|---|
| JP | 2001-118909 | 4/2001 |
| JP | 2002-164413 | 6/2002 |
| JP | 2005-526393 A | 9/2005 |
| JP | 2007-242980 | 9/2007 |
| JP | 2009-141300 | 6/2009 |

* cited by examiner

PITCH CHANGE DEVICE AND PITCH CHANGE METHOD

TECHNICAL FIELD

The present invention relates in general to a pitch conversion device and a pitch conversion method.

BACKGROUND

A rack is used to move multiple planar workpieces. The rack is typically provided with a plurality of partition members such that a workpiece is stored between the partition members mounted adjacent to each other. When picking up the workpiece one by one by clamping to hold in a chuck, the pitch between adjacent or neighboring workpieces should be increased in order to insert the chuck between adjacent workpieces. Expansion of the pitch of the workpiece is accomplished by expanding the pitch of the partition members of the rack.

In Japanese Patent Application Publication No. 7-183357, a substrate array pitch conversion device is proposed with a plurality of entry members which may enter into between adjacent substrate holding members (corresponding to the partition members), entry member actuating means to allow or cause the plurality of entry members to enter into and retract from between the substrate holding members, and moving means to move the multiple substrate holding members in a close proximity to each other. The plurality of entry members are arranged such that they enter spaces between neighboring substrate holding members substantially simultaneously (hereinafter referred to as the first conventional technology).

Japanese Patent Application Publication No. 7-183357 also proposes another substrate array pitch conversion device in which, by varying the respective heights of the entry members, after the one entry member has entered between the neighboring substrate holding members, another member adjacent to that entry member is about to enter between the adjacent substrate holding members (hereinafter referred to the second conventional technology).

BRIEF SUMMARY

In the first conventional technology, multiple entry members enter or ingress between adjacent substrate holding members at the same time However, even if an end substrate holding member is positioned in respect of an end entry member, the position of the other end substrate holding member is influenced by the dimensional tolerances of all the substrate holding members. Therefore, the positional deviation or misalignment of the other end substrate holding member against the other end entry member increases. Thus, it is difficult in practice to allow or cause a plurality of entry members to enter between a plurality of substrate holding members simultaneously.

In the second conventional technology, a member of more than one entry members is allowed to ingress between adjacent substrate holding members in turn. In this case, if the positioning of a first substrate holding member at one end against a first member of the entry member is made, the position of the neighboring, second substrate holding member is determined by only a dimensional error of the second substrate holding member. Therefore, the positional misalignment between the position of the second substrate holding member and the second entry member is smaller. Thus, it is possible for the plural entry members to enter between the substrate holding members adjacent to each other.

However, in the second conventional technology, the problem of an over-sizing of a pitch conversion device is encountered due to the different heights of the plurality of entry members, which would be necessary to move the plurality of entry members in turn.

The present invention has been made in view of the above problems, and has an objective to provide for a small sized pitch conversion device to make sure that a plurality of entry members may enter between neighboring partition members. Also, it is designed to provide a method of pitch conversion such that a plurality of entry members may enter between the neighboring partition members with accuracy.

In order to solve the above problems, a pitch conversion device according to the present invention is characterized by provision of a device that converts the pitch of a plurality of plate shaped members arranged parallel to each other along a first direction. Also provided are a plurality of entry members arranged parallel along the first direction and configured to enter between the neighboring plate shaped members as well as an extrusion or pushing member that is configured to push the plurality of the entry members in order or in turn to ingress between the neighboring plate shaped members in sequence while moving in the first direction.

According to the present invention, once the first plate shaped member is positioned with respect to a first entry member at one end of the first direction, the position of the other plate shaped member may be determined by a dimensional error of that plate shaped member so that the positional misalignment of the plate shaped member against the entry member is smaller. Therefore, it is possible to enter a plurality of entry members between the neighboring plate shaped members with accuracy.

Moreover, because the extrusion or pushing member pushes the plurality of entry members while moving in the first direction, there is no need to make the heights of the entry members different from one another. Therefore, it is possible to reduce the size of the pitch conversion device. The entry members are characterized in that they are biased or urged in the direction of exit from between the neighboring or adjacent plate-shaped members.

According to the present invention, after the completion of pitch conversion work, all the entry members have exited from between the adjacent plate shaped members. Therefore, when a rack storing the partition members is transferred to a post-process, it is possible to avoid interference between the partition members and entry members.

In addition, the pitch conversion device can include a sensor which detects that all the entry members have exited from between the adjacent plate-shaped members.

According to the present invention, it is possible to reliably avoid interference between the partition members and the entry members.

The extrusion or pushing member can include a first inclined surface to allow pushing out the entry members to enter between the neighboring plate shaped members and a holding surface to hold the entry members while holding the entry members between the neighboring plate shaped members in an entered state.

According to the present invention, the extrusion or pushing member has a first inclined surface that allows or causes to push the entry members gradually between the plate shaped members so that the pitch of the plate shaped members may be converted accurately. In addition, because the extrusion or pushing member has a holding surface, the first entry member of first ingress and the second plate shaped member whose pitch has been expanded due to the ingress of the first entry member are kept in contact with each other. In this state, by allowing the second entry member ingresses next, while blocking the second planer shaped member to move in a pitch reducing direction, the third planer shaped member may be moved in a pitch expanding or widening direction. Therefore, it is possible to accurately convert the pitch of the plate-shaped members.

According to a pitch conversion method of the present invention, such a pitch conversion method is employed in which a pitch conversion is made by allowing a plurality of entry members arranged in parallel in a first direction to enter between a plurality of plate shaped members also arranged in parallel in the first direction. Specifically, the method includes a step of entering the first entry member into the first plate shaped members and second plate shaped member adjacent or neighboring to each other, a step of entering the second entry member into the second plate shaped member and third plate shaped member adjacent to or neighboring each other while holding the first entry member between the first plate shaped member and second plate shaped member in an ingress or entered state, and a step of extracting the first entry member from between the first plate shaped member and the second plate shaped member.

According to the present invention, both the entry member of first entry and the second plate shaped member that moves in a pitch expanding direction due to the ingress of first entry member are held in a contact state. In this state, by ingression or entry of the next, second entry member, the third plate shaped member may move in a pitch expanding direction while avoiding the second plate shaped member moving in a pitch reducing direction. Then, by extracting the first entry member, the pitch of the plate shaped members may be converted with accuracy.

According to the pitch conversion device of the present invention, if the first plate shaped member at one end is positioned with respect to the first entry member at one end portion in a first direction, the position of the other plate shaped member is determined by the dimensional error of that plate shaped member only, the difference of the position of the plate shaped member relative to the entry member will be smaller. Therefore, it is possible to ingress or enter a plurality of entry members into adjacent plate shaped members with accuracy.

Moreover, because the extrusion or pushing member pushes out the plurality of entry members in turn or sequentially while moving in the first direction, there is no need to make the heights of entry members different form one another. Therefore, the pitch conversion device may be made compact.

BRIEF DESCRIPTION OF THE DRAWINGS

The description herein makes reference to the accompanying drawings wherein like reference numerals refer to like parts throughout the several views, and wherein:

FIG. 4A depicts a plan view and FIG. 4B depicts a side view.

DETAILED DESCRIPTION

In the following, embodiments according to the present invention will be described with reference to the accompanying drawings. Note that the direction along which partition members of the rack are arranged is defined as an X direction (+X direction denotes a pitch expansion direction), the direction of advance/retract of entry member 11 is defined as a Y direction (+Y denotes an advance/ingress direction, −Y denotes a retracting direction) and the direction orthogonal to both X and Y is defined as a Z direction. Note further that a plan view refers to the direction when viewed from the direction of +Z toward −Z direction.

Figure 4A:
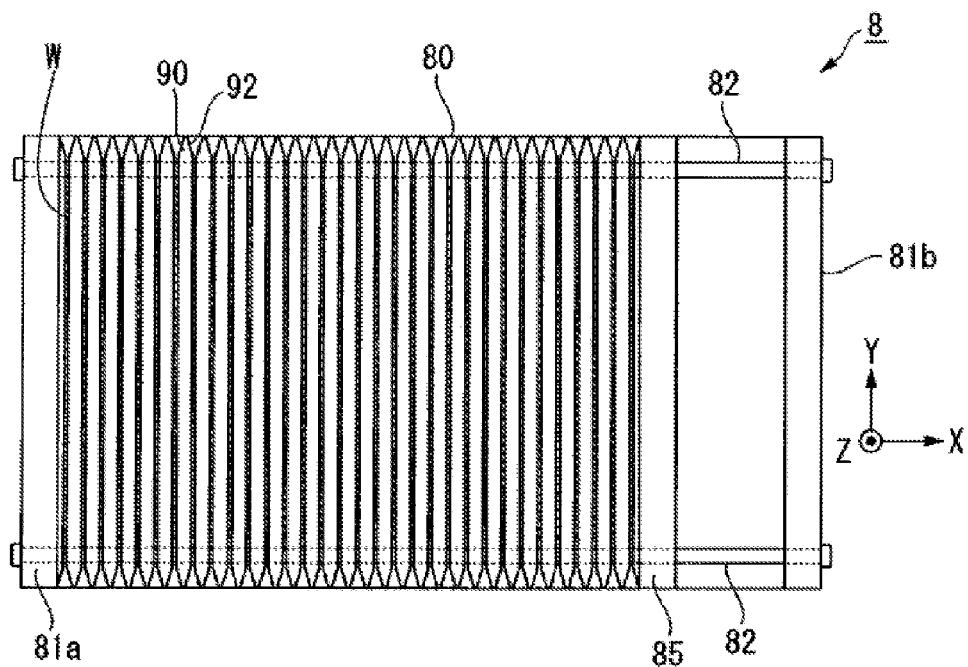
FIGS. 4A and B are explanatory diagrams of rack containing partition members, where
Figure 4B:
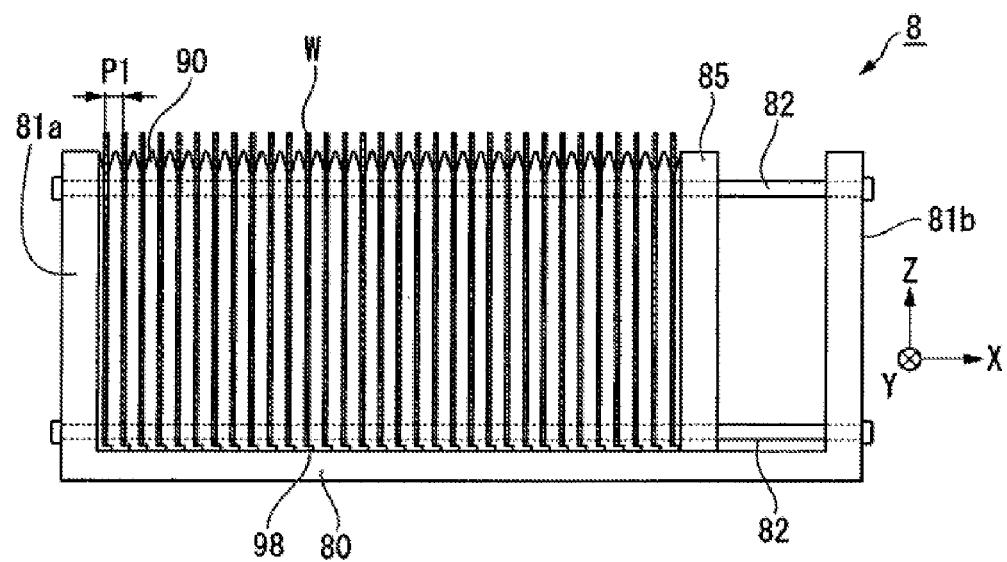

FIGS. 4A and 4B are explanatory diagrams of a rack with partition members, where FIG. 4A is a plan view and FIG. 4B is a side view. Rack 8 has a plurality of partition members (plate shaped members) 90 arranged in parallel to one another in the X direction (first direction) and stores a plate shaped workpiece W between the neighboring partition members 90. The workpiece to be stored or mounted may be various substrates or storage cells and the like.

As shown in FIG. 4B, rack 8 is provided with a bottom plate 80 and a pair of side plates 81a, 81b extending upright from both ends of bottom plate 80. The four corners of the respective side plates 81a, 81b are each provided with guides 82 connecting both side plates 81a, 81b. Between the pair of side plates is disposed an intermediate plate 85. Four corners of intermediate plate 85 are provided with through holes into which guide 82 are inserted. By this arrangement, intermediate plate 85 is movable along guide 82 in the X-direction.

Partition members 90 are each formed in the shape of a rectangular plate, which is disposed between the side plate 81a at one side and the intermediate plate 85. The four corners of the partition member 90 are formed with through holes and the guides 82 have been inserted into the through holes. The partition member 90, similar to intermediate plate 85, is movable along the X direction as in the case of intermediate plate 85.

As shown in FIG. 4A, the partition member 90 will be chamfered to form inclined surface 92 at corners formed by an end surface in Y direction and end surfaces in ±X direction. Thus, the tip of the partition member 90 in the Y-direction is made tapered in plain view.

As shown in FIG. 4B, a work supporting member 98 is erected along the bottom plate 80 of the rack 8 and workpieces W are mounted to the supporting member. In a state in FIG. 4B of prior to pitch expanding state, the partition members 90 and workpieces W are arranged alternately in close contact while the pitch of the partition members 90 is P1.

Figure 5:
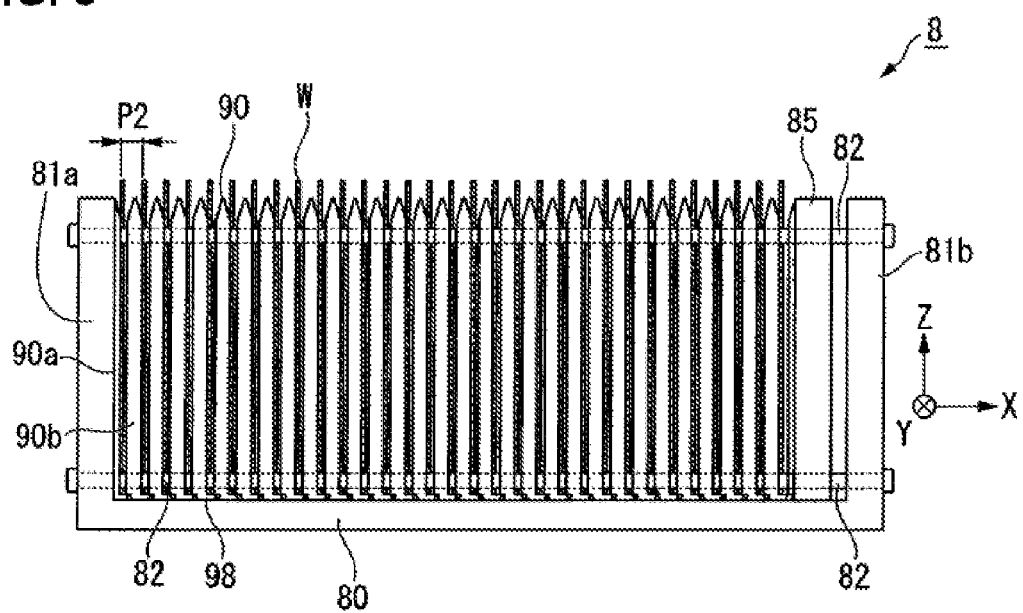
FIG. 5 is a side view of the rack after widening the pitch of the partition members.

FIG. 5 is a side view of rack after the enlarged pitch. In this state, a gap is open between the workpiece W mounted in close contact to the first partition member 90a and the second partition member 90b next to the first partition member 90a. Pitch of the partition members 90 in this state has become P2 (>P1). In addition, even if intermediate plate 85 moves in the X direction along with the expansion of pitch, rack is designed to avoid interference of intermediate plate 85 with side plate 81b. In addition, even if the neighboring partition plates 90 are spaced apart, each partition member 90 will not be inclined due to support by guide 82.

Figure 1:
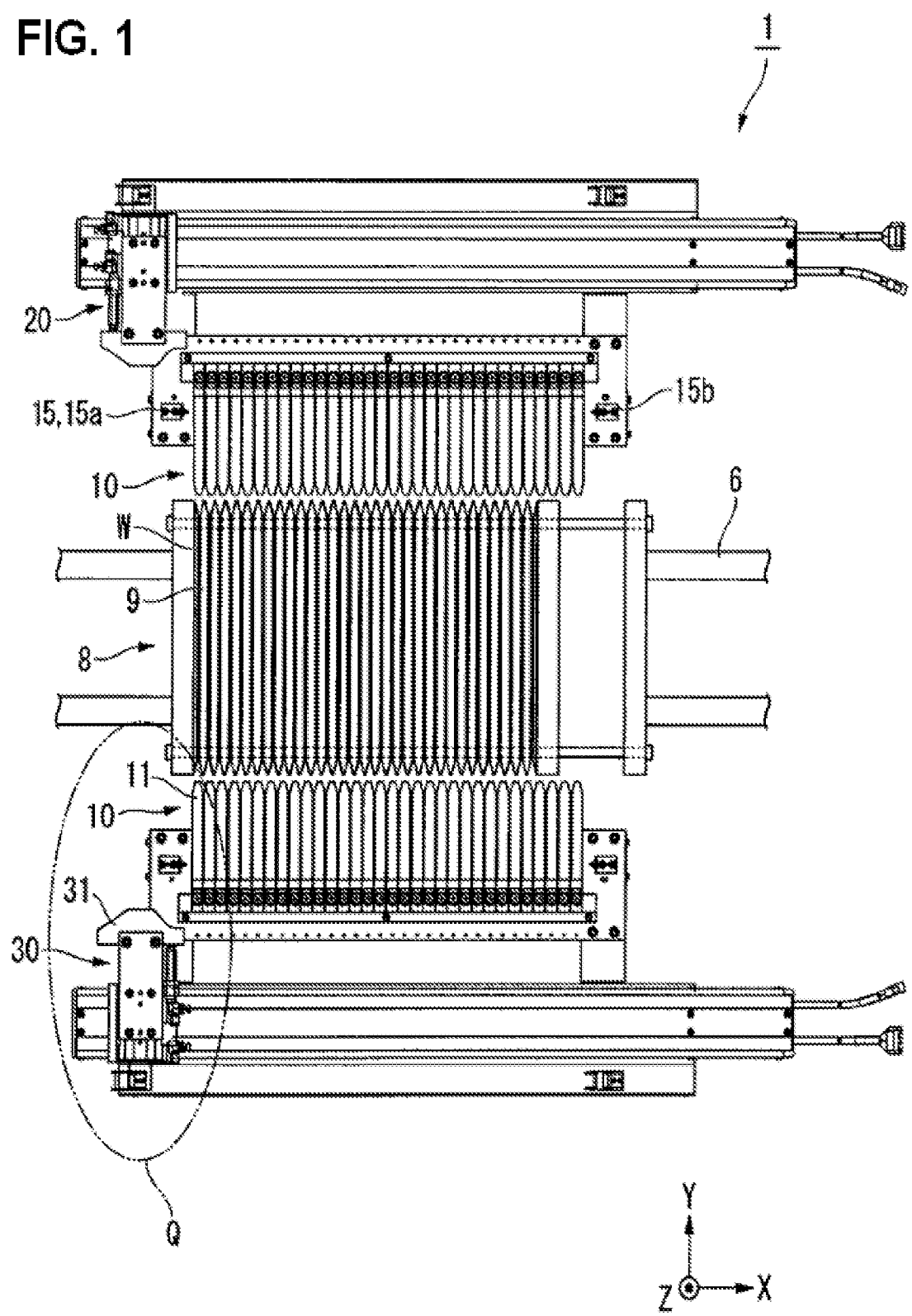
FIG. 1 is a plan view of a pitch conversion device.

FIG. 1 is a plan view of a pitch conversion device. A pitch conversion device according to the present embodiment is a device to convert the pitch of the above described partition members 90 in a rack in widening manner. The pitch conversion device includes conveying means for conveying rack 8 in the X-direction, a plurality of entry members 11 disposed at both sides of the conveying means in parallel in the X-direction and configured to ingress or enter between neighboring partition members 90, a slide mechanism 10 to slide the entry members in the Y-direction, a pushing or extraction member 31 located outside of the slide mechanism 10 and pushes the plurality of entry members in the Y-direction in turn, and finally a moving mechanism 30 to move the pushing member 31 in both X and Y directions. Conveying means 6 is formed by a roller conveyor, for example.

Figure 2:
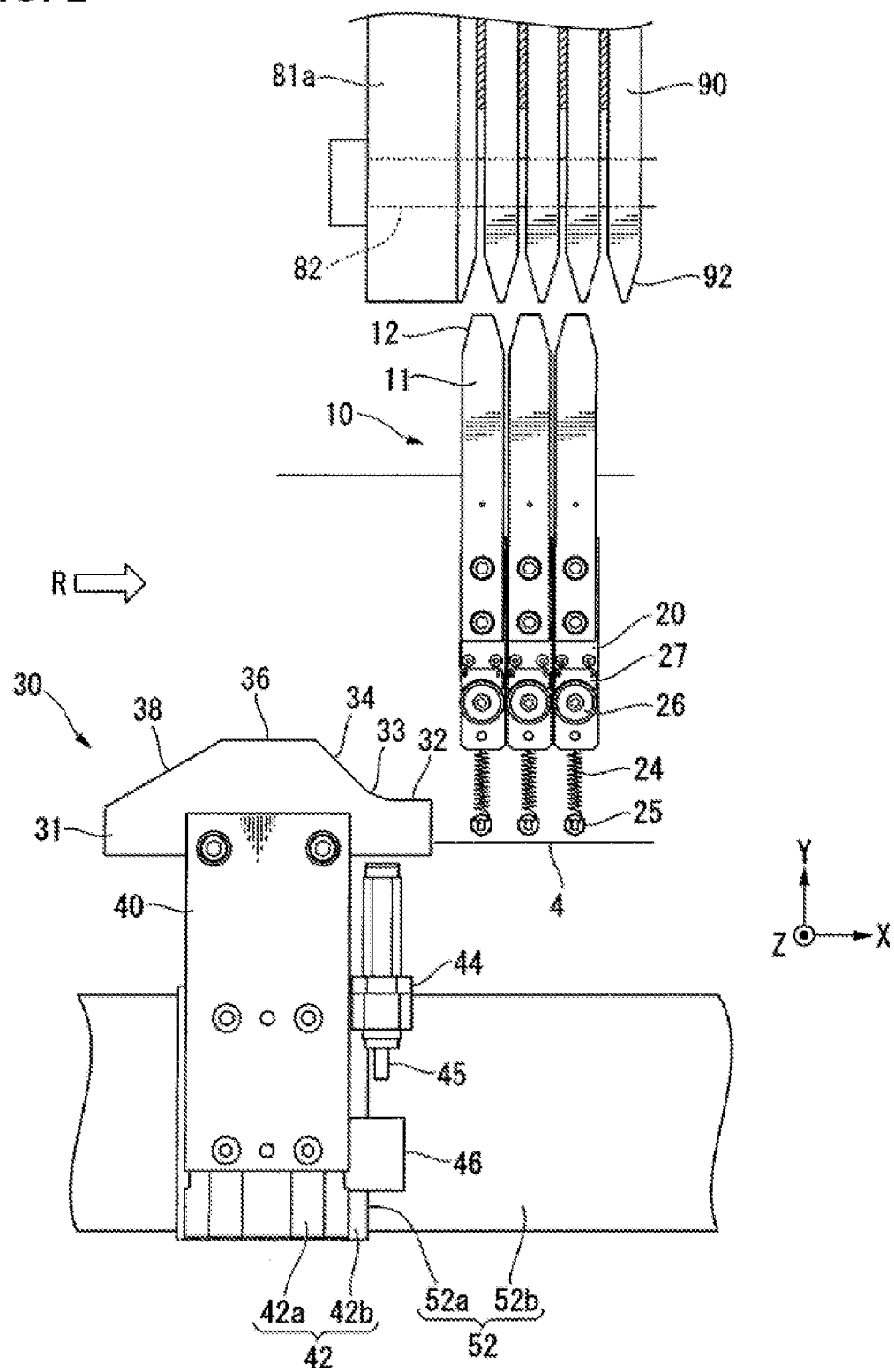
FIG. 2 is an enlarged view of Q part of FIG. 1.

FIG. 2 is an enlarged view of part Q of FIG. 1. As shown in FIG. 2, the slide mechanism 10 is provided with entry members 11 to ingress or enter between the neighboring partition members 90, a base member 20 to which the entry members are securely mounted, and a linear guide 22 (see FIG. 3) to slide the base member 20 relative to base member 4.

As shown in FIG. 2, entry members 11 are formed in a generally square or rectangular column. The width of entry members in the X-direction is set so that a predetermined pitch between the neighboring partition members 90 is formed when the entry member 11 enters between the neighboring partition members 90. The entry members 11 are formed with an inclined surface 12 by chamfering respective corners formed with an end surface in +Y direction and end surfaces in ±X-direction. Thus, the tip of entry member 11 in +Y direction is in a tapered shape in plan view. The entry members 11 are fixed to the base member 20 by bolts or the like.

The base member 20 is formed into strips. The width in the X direction of the base member 20 is formed equally to the entry member 11. On a +Z surface of the base member is mounted a central axis of the cam follower 26. The outer peripheral surface of the cam follower 26 is in a sliding relationship with the pushing member 31 described below. Therefore, a lubricant supply portion 27 is provided adjacent to the cam follower 26 to supply lubricant to the outer peripheral surface of the cam follower 26. Coil spring 24 is located in −Y direction of base member 20. One end of the coil spring 24 is fixed to the base member 20, and the other end of the coil spring 24 is fixed to the base member 4 via bolts 25.

Figure 3:
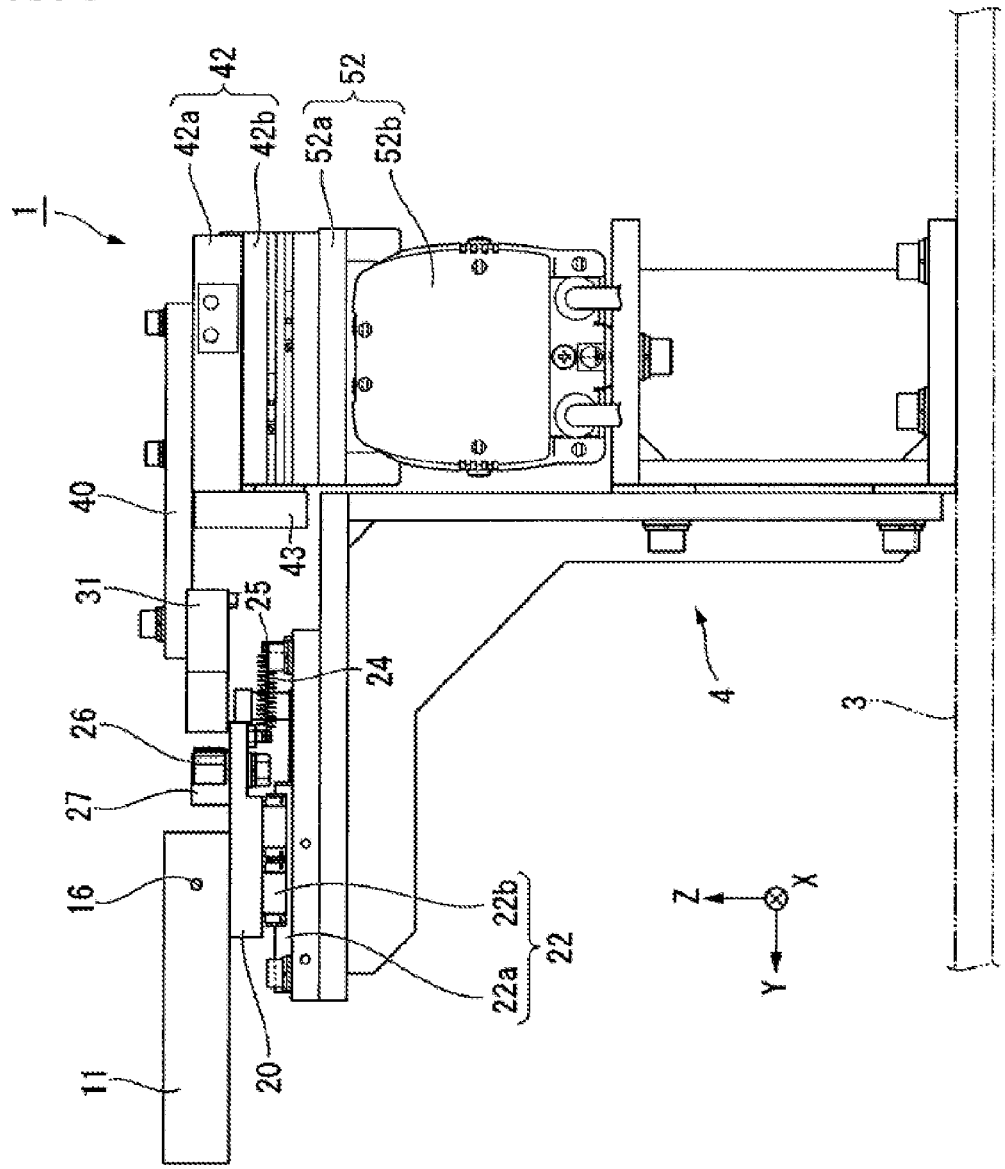
FIG. 3 is a perspective view viewed from R.

FIG. 3 is a diagram viewing FIG. 2 from the arrow R (front view). As shown in FIG. 3, linear guide 22 is provided with both a rail 22a extending in the Y-direction and a slider 22b sliding along the rail 22a. Rail 22a is fixed to the base 4 while the slider 22b is fixed to the base member 20 described above. The base member 20 is urged or biased in −Y direction by way of coil spring 24 as above described.

As shown in FIG. 1, a pitch conversion device 1 of this embodiment is provided with a sensor 15 that detects that all the entry members 11 have exited from between the neighboring partition members. More specifically, in the directions of ±X directions of the multiple entry members 11, are arranged a light-emitting part 15a and the light receiving portion 15b of the photo sensor, respectively. Entry members 11 are formed with a through hole 16 along the X direction as shown in FIG. 3. Thus, when the light emitted from the light-emitting part (15a) shown in FIG. 1 is incident on the light receiving portion 15b through the through hole 16 of all the entry members 11, it may be detected that all the entry members 11 exit from partition members 90.

As shown in FIG. 2, the moving mechanism 30 is provided with a pushing member 31 to push out the entry members 11 in +Y direction, a Y-direction moving mechanism 42 to move the pushing member 31 in the Y-direction, and an X-direction moving mechanism 52 to move the pushing member 31 (and the Y-direction moving mechanism 42) in the X-direction.

Pushing member 31 is formed in the shape of a flat plate. The side surface in +Y direction of pushing member 31 functions as a holding surface 36 to hold the entry member 11 in its ingress state between neighboring partition members 90. In addition, the pushing member 31 is chamfered at corners formed by the holding surface 36 and a side surface in +Z direction to form a first inclined surface 34. The first inclined surface functions to push an entry member to enter or ingress between the neighboring partition members 90. Further, at an end of +X direction of the pushing member 31 is formed with an introduction surface 32 in parallel with the holding surface 36 and the first inclined surface 34 is formed over from this introduction surface 32 to the holding surface 36. In addition, between the introduction surface 32 and the first inclined surface 34 is formed with a curved surface 33 to smoothly connect the two surfaces. In addition, a second inclined surface 38 is formed with the pushing member 31 by chamfering a corner formed between holding surface in +Y direction and a side surface in −Z direction. The second inclined surface 38 has a function to allow the entry member 11 to exit from between the neighboring partition members 90. Note that the inclination angle of the second inclined surface 38 with respect to the holding surface 36 is set smaller than the inclination angle of the first inclined surface 34. Pushing member 31 is fixed to the base member 40.

As shown in FIG. 3, the Y-direction moving mechanism 42 is composed of an air cylinder with a guide, for example, and includes a portion 42b housing a cylinder (not shown) and a moving part 42a connected to a rod (not shown). Moving part 42a is connected to the base member 40 for supporting the pushing member 31 while fixed portion 42b is connected to moving part 52a of the X-direction moving mechanism 52. In addition, Y-direction moving mechanism 42 is provided with a shock absorber as shown in FIG. 2. When the moving part 42a moves in +Y direction, a stopper connected to the moving part 42a pushes rod 45 of shock absorber 44 connected to the fixed portion 42b, thus may stop moving part 42a slowly.

As shown in FIG. 3, the X-direction moving mechanism 52 is composed of a single-axis robot, for example, and is provided with an orbital portion 52b extending along the X direction and a moving part 52a movable along the orbital portion 52b. The moving part 52a is connected to the fixed part 42b and the orbital part 52b is fixed to base 4, respectively.

Figure 6:
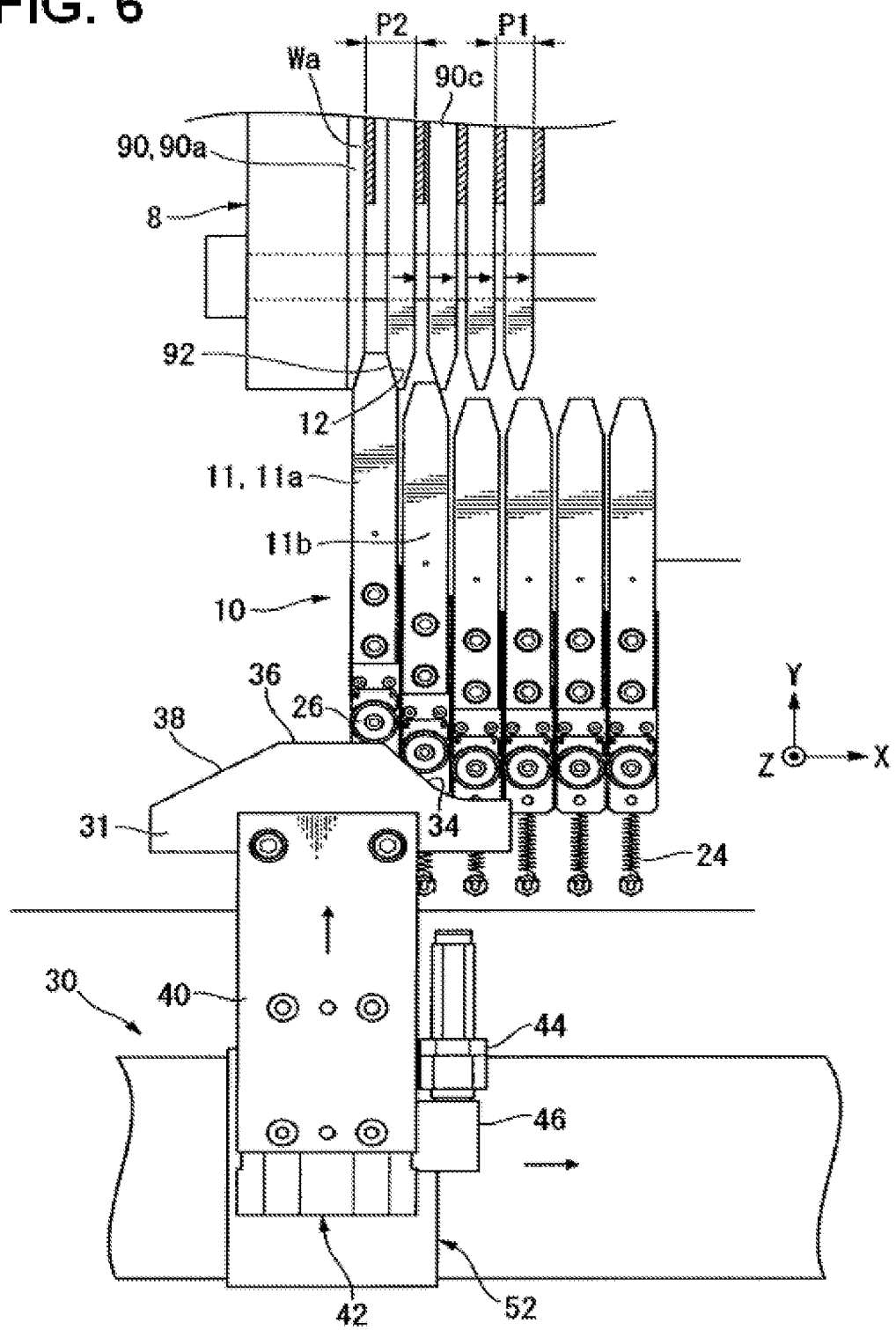
FIG. 6 is a first explanatory diagram describing the pitch conversion mechanism including an enlarged view of a portion corresponding to the Q section in FIG. 1.
Figure 7:
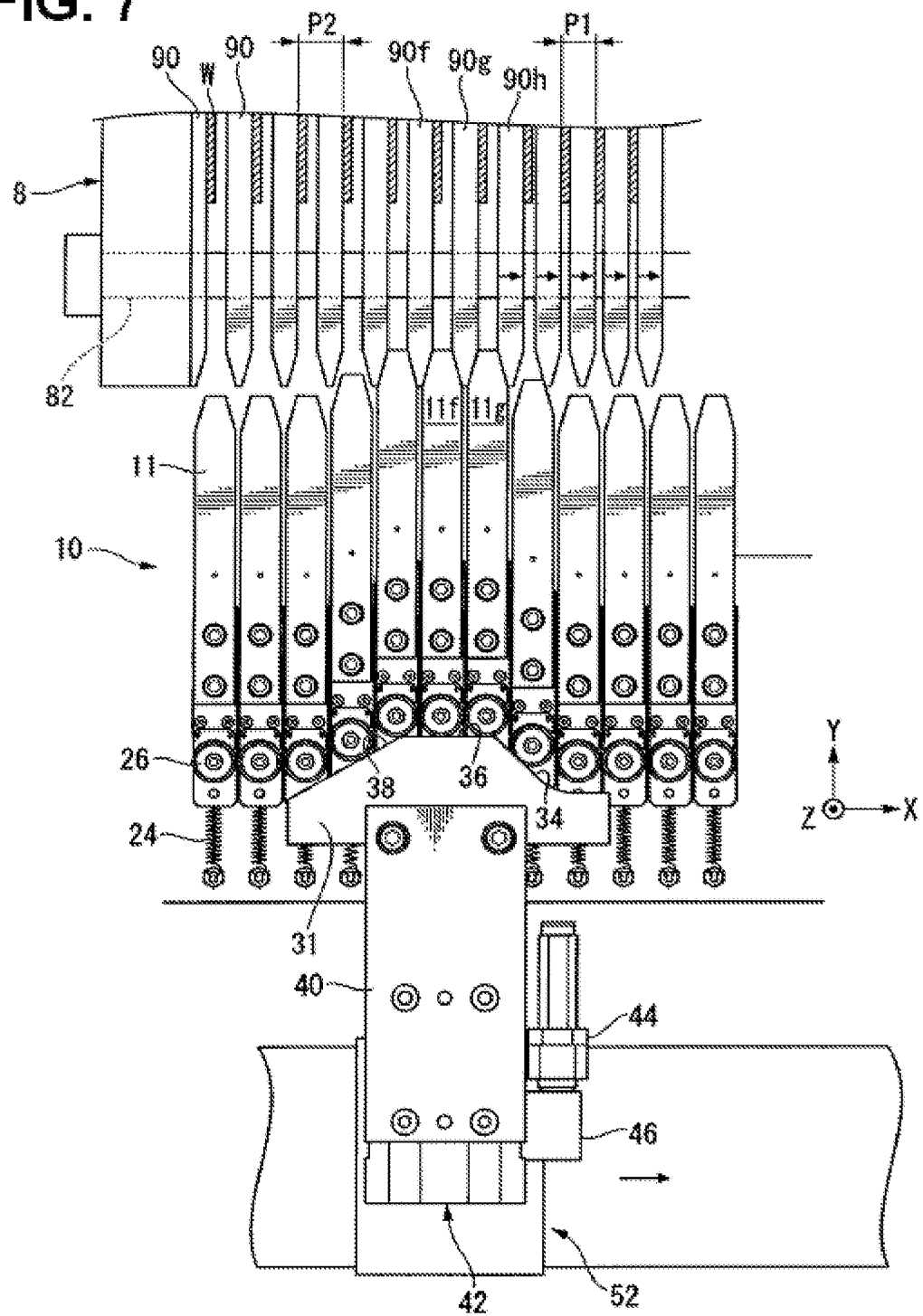
FIG. 7 is a second explanatory diagram describing the pitch conversion mechanism including an enlarged view of a portion corresponding to the Q section in FIG. 1.

Next, a description will be given about how to convert pitch using the pitch conversion device described above. FIG. 6 and FIG. 7 are explanatory diagrams regarding a pitch conversion principle and present an enlarged view of a portion corresponding to the Q section in FIG. 1. First, by the conveying means 6 shown in FIG. 1, rack 8 is carried in the central part of a pitch conversion device 1. As shown in FIG. 6, in respect of a first entry member 11a disposed at the end of −X direction out of a plurality of entry members 11, a positioning of a first partition member 90a located at the end of −X direction among a plurality of partition members 90 will be performed. In this state, rack 8 is fixed to the pitch conversion device 1.

Next, the Y-direction moving mechanism 42 among moving mechanism 30 of pushing member 31 is driven to push pushing member 31 in the +Y direction. Subsequently, while holding this state the X-direction moving mechanism 52 is driven to move the pushing member 31 in the +X direction. Then, the first inclined slope 34 of pushing member 31 abuts against cam follower 26 of the slide mechanism 10 to press the cam follower 26 in the +Y direction. Thus, the first entry member 11a is pressed in the +Y direction first. The first entry member 11a enters between the first partition member 90a located at the end of the X direction among the partition members stored in rack 8 and the second partition member 90b adjacent to the first partition member 90a in the +X direction.

Here, the rack 8 is positioned and fixed to pitch conversion device 1 and the first partition member 90a is adhered to rack 8, the first partition member will not move in the −X direction, even at the intrusion of the first entry member 11a. In contrast, the second partition member 90b is held movable in the X direction, upon entry of the first entry member 11a, the second partition member 90b moves in the +X direction. In response to pressing action by the second partition member 90b, all the partition members present in the +X direction of the second partition member 90b move in the +X direction. As a result, the second partition member 90b is spaced apart from the first workpiece Wa stored in the first partition member 90a, the pitch between the first partition member 90a and second partition member 90b will be converted to widen or expand from Pl to P2.

In this state, the side of the second partition member 90b in the −X direction is in close contact with the first entry member 11a. Therefore, the positional deviation of the +X side surface of the second partition member 90b is determined by the error in thickness dimension only. Compared to the overall thickness errors of the entire partition members 90, the error in the thickness of a single partition member is small. Therefore, the positional deviation of the +X side surface of the second partition member 90b with respect of the second entry member 11b will be smaller. Hence, the second entry member 11b may be entered or intruded between the second partition member 90b and the third partition member 90c with certainty.

When the pushing member 31 is driven to move in the +X direction, as shown in FIG. 7, a plurality of entry members enter between the neighboring partition members 90 sequentially. The pushing member 31 is formed with a holding surface 36 contiguous to the first inclined surface 34 and perpendicular to the Y direction. As long as the cam follower abuts against this holding surface 36, the entry member 11 may be held in ingress state between the neighboring partition members 90.

As shown in FIG. 7, a state is discussed in which the seventh entry member 11g enters between the seventh partition member 90g and the eighth partition member 90h. In this instance, between the sixth partition member 90i and the seventh partition member 90g is being held the sixth entry member 11f. Since sixth entry member 11f is in abutment to the −X side surface of seventh partition member 90g, movement of seventh partition member 90g in the −X direction will be restricted by sixth entry member 11f. Therefore, seventh partition member will not move in the −X direction even at the entry of the seventh entry member 11a. In contrast, since the eighth partition member 90h is held movable in the X direction, upon entry of seventh entry member 11g, eighth partition member 90h moves in the +X direction. In response to the pushing action from the eighth partition member 90h, all the partition members 90 located in the X direction from eighth partition member 90h moves in the +X direction. Consequently, the pitch between seventh partition member 90g and eighth partition member 90h will be converted for expansion from P1 to P2.

Pushing member 31 is formed with a second inclined surface 38 that follows the holding surface 36. Note that the entry members are biased by coil spring 24 in the direction of exit from between the adjacent or neighboring partition members 90. Therefore, the cam follower 26 is pulled back along the second inclined surface 38, and the entry member 11 exits from between the adjacent partition members 90 by move in the −Y direction of −Y.

Incidentally, since the angle of inclination of the inclined surface 38 of the second inclined surface 38 relative to holding surface 36 is formed smaller than that of the first inclined surface 34, entry member 11 exits relatively slowly from between the adjacent partition members 90. Therefore it can be prevented that the position of partition members 11 will shift when the entry member exits.

Note that, even if the entry member 11 exits and the neighboring partition members 90 will be made spaced apart from each other, the partition members 90 will not tilt or deflect due to support provided by four guides 82.

In this way, by entering and then retracting all the entry members between the associated partition members 90, the pitch of all partition members 90 may be converted for expansion. Along with this, the pitch of the workpieces W stored in rack 8 will equally converted for expansion After having moved the pushing member 31 to the end of the X direction, the Y-direction moving mechanism 42 will be driven and pushing member 31 will be retracted in the −Y direction. In this state, the X-direction moving mechanism 52 is driven and the pushing member 31 will be moved to an end of the −X direction. Therefore, pushing member 31 may be moved in the X direction while avoiding interference between the sliding mechanism 10 of entry members 11 and the pushing member 31.

Because the entry members 11 are urged in the −Y direction, after the completion of the pitch conversion work, a situation may be encountered in which all the entry members 11 exit from the neighboring partition members 90. Here, it may confirmed that all the entry members have exited from the partition members 90 when the light emitted from the light emitting part 15a of the sensor 15 shown in FIG. 1 is incident upon light receiving part 15b, through the thorough hole 16. This makes it possible to transport rack 8 to the post-process while making sure of reliably avoiding interference between the entry member 11 and the partition member 90.

As described above, the pitch conversion device of the present embodiment shown in FIG. 1, a pitch conversion device for converting the pitch of a plurality of plane shaped partition members 90 arranged in parallel in the X direction is provided and the devise is configured to include a plurality of entry members 11 arranged in parallel in the X direction and to enter between the neighboring partition members 90 and a pushing member 31 to push out the plurality of entry members in turn to allow to enter between the neighboring partition members 90 sequentially while moving in the X direction.

According to this configuration, once the first partition member 90a is positioned relative to the first entry member 11 as shown in FIG. 6, the position of the other partition member 90 may be determined by the dimension error of that partition member 90 only, so that the positional deviation of partition member 90 with respect to entry member 11 will be smaller.

Therefore, regardless of the dimension error of partition member 90, a plurality of entry members 11 may reliably enter between neighboring partition members In addition, since pushing member 31 pushes out a plurality of entry members 11 in order moving in the X direction, there is no need to use different heights of the members 11. Therefore, it is possible to reduce the size of the pitch conversion device.

It should be noted that the technical scope of the present invention is not intended to be limited to the embodiments described above, but as long as in the range without departing from the spirit of the present invention, those made as various changes to the above-described embodiment may also be included. In other words, the concrete material or layer structure mentioned in the embodiment are merely an example, it is thus possible to change appropriately.

For example, in the embodiment, the pitch is converted for widening of the partition members as plate shaped member, it may be envisaged that the pitch of workpieces may be directly converted for expansion.

The invention claimed is:

1. A pitch conversion device for converting the pitch of a plurality of plate shaped members arranged in parallel in a first direction, comprising:
   a plurality of entry members arranged in parallel along the first direction, each of the plurality of entry members configured to enter between two adjacent plate shaped members respectively; and
   a pushing member configured to move in the first direction while sequentially pushing each of the plurality of entry members in a second direction in between the respective adjacent plate shaped members, thereby moving in the first direction a portion of the plurality of plate shaped members that are downstream of the pushing member in the first direction.

2. The pitch conversion device as claimed in claim 1, wherein the plurality of entry members are biased in an exiting direction from between the adjacent plate shaped members, the exiting direction being opposite the second direction.

3. The pitch conversion device as claimed in claim 1 further comprising a sensor configured to detect that all of the plurality of entry members have exited from between the adjacent plate shaped members associated therewith.

4. The pitch conversion device as claimed in claim 1, wherein the pushing member includes:
   a first inclined surface configured to sequentially move each of the plurality of entry members in the second direction to sequentially enter between the respective adjacent plate shaped members; and
   a holding surface configured to sequentially hold each of the plurality of entry members in an entered state between the respective adjacent plate shaped members.

5. The pitch conversion device as claimed in claim 4, wherein each of the plurality of entry members comprises a cam follower configured to follow along the first inclined surface and holding surface.

6. The pitch conversion device as claimed in claim 4, wherein the pushing member further comprises a second inclined surface opposite the first inclined surface with the holding surface positioned in between, the second inclined surface configured to sequentially release each of the plurality of entry members from between the respective adjacent plate shaped members.

7. The pitch conversion device as claimed in claim 6, wherein the plurality of entry members are biased in an exiting direction from between the adjacent plate shaped members, the exiting direction being opposite the second direction.

8. The pitch conversion device as claimed in claim 1, wherein the second direction is perpendicular to the first direction.

9. A pitch conversion method comprising:
sequentially entering a plurality of entry members disposed in parallel in a first direction into a plurality of plate shaped members disposed in parallel along the first direction by:
   moving a pushing member in the first direction while the pushing member:
      moves a first entry member in a second direction to enter between a first plate shaped member and a second plate shaped member adjacent to the first plate shaped member;
      moves a second entry member in the second direction to enter between the second plate shaped member and a third plate shaped member adjacent the second plate shaped member while holding the first entry member in an entered state between the first plate shaped member and the second plate shaped member by the pushing member; and
      moves the first entry member in an exit direction opposite the second direction to extract the first entry member from between the first plate shaped member and the second plate shaped member.

10. The pitch conversion method as claimed in claim 9, wherein the second direction is perpendicular to the first direction.

11. The pitch conversion method as claimed in claim 9, wherein the plurality of entry members are biased in the exiting direction from between the adjacent plate shaped members, and wherein extracting comprises allowing the first entry member to gradually move in the exiting direction from between the first plate shaped member and the second plate shaped member.

12. The pitch conversion method as claimed in claim 9, further comprising:
   detecting that all of the plurality of entry members have been extracted from between the adjacent plate shaped members associated therewith.

13. The pitch conversion method as claimed in claim 9, wherein moving the first entry member to enter between the first plate shaped member and the second plate shaped member adjacent to the first plate shaped member comprises:
   moving the first entry member along a first inclined surface of the pushing member, and wherein holding the first entry member in the entered state comprises:
   moving the first entry member along a holding surface of the pushing member configured to hold the first entry member in the entered state between the first plate shaped member and the second plate shaped member.

14. The pitch conversion method as claimed in claim 13, wherein moving the first entry member to extract from between the first plate shaped member and the second plate shaped member comprises:
   moving the first entry member along a second inclined surface extending from the holding surface of the pushing member, wherein the second inclined surface extends from the holding surface opposite the first inclined surface.

15. The pitch conversion method as claimed in claim 14, wherein each of the plurality of entry members comprises a cam follower and wherein moving each of the plurality of entry members comprises contacting the cam follower with the first inclined surface, the holding surface and the second inclined surface as the first inclined surface, the holding surface and the second inclined surface move in the first direction.

* * * * *